United States Patent [19]
Chang

[11] Patent Number: 5,895,959
[45] Date of Patent: Apr. 20, 1999

[54] INPUT PORT ELECTROSTATIC DISCHARGE PROTECTION CIRCUIT FOR AN INTERGRATED CIRCUIT

[75] Inventor: Ming-Chien Chang, Hsinchu, Taiwan

[73] Assignee: Vanguard International Semiconductor Corporation, Taiwan

[21] Appl. No.: 08/770,168

[22] Filed: Dec. 19, 1996

[30] Foreign Application Priority Data

Oct. 14, 1996 [TW] Taiwan ................... 85112509

[51] Int. Cl.$^6$ ................... H01L 23/60; H01L 29/78
[52] U.S. Cl. ................... 257/360; 257/358; 257/365
[58] Field of Search ................... 257/356–358, 257/360, 365

[56] References Cited

U.S. PATENT DOCUMENTS

| | | | |
|---|---|---|---|
| 4,609,931 | 9/1986 | Koike | 257/357 |
| 4,616,243 | 10/1986 | Minato et al. | 257/357 |
| 4,745,450 | 5/1988 | Hartranft et al. | 257/360 |
| 5,272,586 | 12/1993 | Yen | 257/356 |

Primary Examiner—Gene M. Munson
Attorney, Agent, or Firm—Fish & Richardson P.C.

[57] ABSTRACT

An input port electrostatic discharge protection circuit is disposed between the input port of an integrated circuit and an input point of an internal circuit of the integrated circuit. The input port electrostatic discharge protection circuit includes a resistor and a field device. The ends of the resistor are connected to the input port of the integrate circuit and the input point of the internal circuit, respectively, and the function of the resistor is to delay ESD pulses for preventing the input port of the internal circuit from a strike directly. The field device has double gates disposed on field oxides. The source and drain of the field device are coupled to the input port of the integrated circuit and a low-voltage source, respectively. The first gate is coupled to the drain of the field device while the second grate is coupled to the source of the field device. The field device mainly provides an ESD path. An additional metal-oxide-semiconductor (MOS) device without a lightly doped drain (LDD) structure can be positioned between the input point of the internal circuit and the low-voltage source to thereby speed-up triggering of the field device to an "on" state. Moreover, an additional field device with the same double gates as the above-referred field device can also be disposed between a high-voltage source of the integrated circuit and the input port of the integrated circuit to enhance ESD protection.

23 Claims, 8 Drawing Sheets

1

INPUT PORT ELECTROSTATIC DISCHARGE PROTECTION CIRCUIT FOR AN INTERGRATED CIRCUIT

BACKGROUND OF THE INVENTION

1. Field of the Invention

The invention relates to a protection circuit for an integrated circuit, and more particularly to an electrostatic discharge (hereafter, ESD) protection circuit disposed at an input pin of the integrated circuit to prevent the gate oxide of a metal-oxide-semiconductor (hereafter, MOS) device from breakdown caused by ESD stress.

2. Description of Related Art

A MOS device of an integrated circuit having four ends consists of a drain, a gate and a source formed within a body. Generally, the body is the substrate of the MOS device or the well region on the substrate. The drain and source, spaced a lateral distance from each other, are doped diffusion regions which are formed on the substrate or the well region of the substrate by diffusion or ion implantation. The gate, disposed between the source and drain on the substrate, is employed to control a channel between the source and drain. In general, the gate consists of a gate oxide and a gate conductor which are formed by a silicon oxide layer and a polysilicon layer, respectively. The MOS device is widely used as a controlled source and a controller switch with control signals inputted to the gate.

The gate of the MOS device is formed by an extremely thin silicon oxide layer of about several hundred Å in thickness. Since the dielectric breakdown strength of the silicon oxide is about $12\times10^6$ V/cm, a gate oxide layer formed by the silicon oxide can withstand a maximum voltage of several ten volts. For example, a gate oxide layer with 150 Å in thickness can withstand a maximum voltage of 18 V. Accordingly, the breakdown strength of the gate oxide mentioned above is large enough to deal with typical input voltages during normal operation. However, a voltage in excess of the maximum voltage (breakdown voltage) may appear at the input pin of an MOS integrated circuit due to ESD stress. Many sources can cause electrostatic stress, including human contact with the integrated circuit, an interference from operation circumstances, etc. Moreover, because the dimensions of MOS devices continue to shrink, the opportunity for breakdown of the gate oxide layer of the MOS device increases.

Therefore, an ESD protection circuit, disposed between the input pin and the internal circuit of the MOS integrated circuit, is needed to protect the internal circuit from ESD damage caused by an outside sudden high voltage applied to the input pin. Basically, a conduction path to a ground or a power source between the input pin and the internal circuit is provided, so the gate of the MOS device can be protected from damage by means of the conduction path when the outside sudden high voltage is applied to the input pin. Currently, a field device known as a thick oxide device is widely employed to be disposed between an input port and a ground (or power source) The above-mentioned field device differs from general MOS devices in that the field device replaces the thin gate oxide with a field oxide. The field oxide having a thickness of about 0.4~1.0 μm is formed by thermal oxidation and is mainly used to define and separate each active region. At present, there are two main field device applications:

The first application employs a field device having a metal gate to attain ESD protection. Referring to FIG. 1, a schematic depiction of an ESD protection circuit for a CMOS integrated circuit is shown. The ESD protection circuit includes a resistor 20, a MOS device 30, and a field device 10, disposed between an input port 2 of the integrated circuit and an input point 4 to which gates of a PMOS 6 and an NMOS 8 are connected. The field device 10 has a gate and a drain connected to each other and mainly provides an ESD path. Generally, the resistor 20 which is formed by an N-type diffusion region on a substrate can delay an ESD stress between the input port 2 and input point 4 to directly protect gates of the PMOS 6 and NMOS 8 from ESD damage. Then the field device 10 is used to attain ESD protection. The MOS device 30 provides a ground path before gates of the PMOS 6 and NMOS 8 and speeds up triggering of the field device 10 to an "on" state to form an ESD path. When an electrostatic current into input port 2 flows to ground through the conducted MOS device 30 from resistor 20, a potential difference will be created on both ends of the resistor 20 such that the gate voltage of the field device 10 can be increased to speed-up triggering of the field device 10 to an "on" state.

Referring to FIG. 2, a cross-sectional view of the field device structure of FIG. 1 is shown. The field device 10 is formed on a P-type substrate 100. An $N^+$ diffusion region 102 serves as the drain region of the field device 10 which is connected to input port 2 by a metal layer 110. An $N^+$ diffusion 104 serves as the source region of the field device 10 and is connected to a ground by a metal layer 112. Field oxides 106 are disposed between the drain diffusion region 102 and the source diffusion regions 104. Metal layer 110 over field oxides 106 forms the gate of the field device 10 with a dielectric layer 108 positioned therebetween for electrical insulation. Basically, the field device structure shown in FIG. 2 includes two parallel field devices. The greater the number of parallel field devices, the more effective the ESD protection.

The ESD protection circuit mentioned above has an obvious application drawback. When an ESD stress appears, the field device having a metal gate will induce a sub-critical current to speed-up triggering action of the parasitic bi-carrier transistor to an "on" state for electrostatic discharge. However, an electric field on the gate channel of the field device will limit the ESD induced current on the surface region of the gate channel. Thus, during operation, a hotspot will be produced on the edge of the drain region of the channel. That is, when the ESD induced current is large enough, the conduction structure of the material on which the hotspot is located will be destroyed due to increased temperature.

The second application employs a field device having no metal gate for attaining ESD protection. The circuit is shown in FIG. 3 wherein devices which are the same as those in FIG. 1 are marked with the same reference numerals. The field device 10 of FIG. 1 having a gate structure is replaced by a field device 40 without a gate structure in FIG. 3. Referring to FIG. 4, a cross-sectional view of the field device 40 of FIG. 3 having no gate structure is shown. Similarly, in FIG. 4 which are the same material layers as those in FIG. 2 are marked with the same reference numerals. As shown in FIG. 4, a metal layer 114 does not directly cover field oxide layers 106. Thus, in the ESD path from the metal layer 114 to metal layer 112, the ESD induced current can flow in any region of the substrate 100 between the drain diffusion region 102 and the source diffusion region 104 so that hotspots near the drain region of the channel can be prevented. However, the field device without a gate structure requires a higher voltage to trigger electrostatic discharge. This will result in non-uniform ESD protection.

3

In summary, the field device mentioned in the first application attains preferred ESD protection, but hotspots will be produced during electrostatic discharge. Although the field device mentioned in the second application can prevent such hotspots, this field device provides non-uniform ESD protection.

SUMMARY OF THE INVENTION

Accordingly, the object of the invention is to provide an input port ESD protection circuit for an integrated circuit which provides more uniform ESD protection.

Another object of the invention is to provide an input port ESD protection circuit for an integrated circuit which can prevent hotspots and increase the life time of the ESD protection circuit.

According to the above-referred objects, the invention provides an input port ESD protection circuit for an integrated circuit which is disposed between an input port of the integrated circuit and an input point of the internal circuit. The ESD protection circuit comprises a resistor and a field device. The resistor can be formed by a diffusion resistor with each end of the resistor connected to the input port of the integrated circuit and the input point of the internal circuit, respectively. The function of the resistor is to delay an ESD pulse to protect the input point of the internal circuit from a strike directly. The field device is formed on field oxides and has a drain, a source, a first gate, and a second gate. The source and drain of the field device are coupled to the input port of the integrated circuit and a low-voltage of the integrated circuit, respectively. The first gate is coupled to the drain of the field device while the second gate is coupled to the source of the field device. The above-mentioned field device mainly provides an ESD path. In addition, a MOS device without a lightly-doped drain structure can be added between the input point of the internal circuit and the low-voltage of the integrated circuit. With respect to its construction, the ESD protection circuit comprises a first metal layer and a second metal layer. The first metal layer has a pair of lead sections which can be connected to the source and drain of the field device, respectively. However, the field oxides are not directly covered by the first metal layer. Rather the field oxide is covered indirectly by the second metal layer to form the first gate and the second gate of the field device which are coupled to the drain and source of the field device through the first metal layer.

For the above-referred ESD protection circuit, another double-gate field device can be added between the high-voltage source of the integrated circuit and the input port of the integrated circuit to, thereby enhance ESD protection.

The objectives, characteristics and advantages of the invention can be explained more clearly by the following description of the preferred embodiments and the drawings.

DETAILED DESCRIPTION OF THE INVENTION

An ESD protection circuit of the invention utilizes a field device having a double-gate structure as an ESD path. A drain and a source of the field device are coupled to an input port of the integrated circuit and a low-voltage of the integrated circuit (or a ground), respectively. A first gate is coupled to a drain of the field device while a second gate is coupled to a source of the field device. With respect to its construction, the ESD protection circuit comprises a first metal layer and a second metal layer. The first metal layer has lead sections which are connected to the source and drain of the field device, respectively. However, field oxides are not directly covered by the first metal layer. Instead, the field oxide is covered indirectly by the second metal layer to form the first gate and the second gate of the field device which are coupled to the drain and source of the field device, respectively, through the first metal layer. The above-noted field device not only prevents the generation of hotspots near the drain region, but also produces a more uniform ESD. There are two embodiments of the ESD protection circuit which will be discussed below. However, these embodiments are not intended to limit the invention.

The First Embodiment

Figure 5:
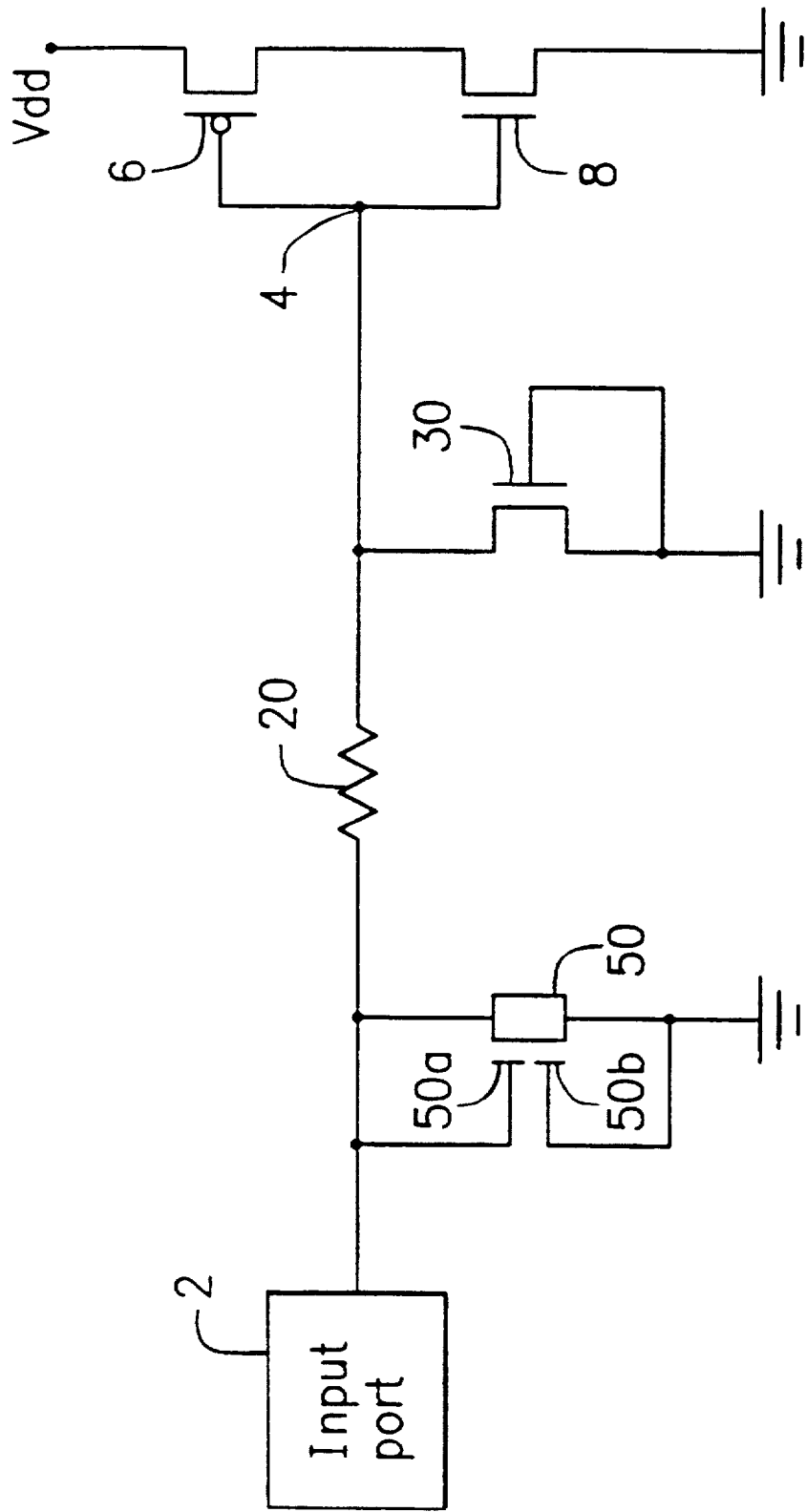
FIG. 5 is a schematic diagram of one embodiment of an ESD protection circuit of the invention.

FIG. 5 is a schematic diagram of a first embodiment of an ESD protection circuit of the invention. The ESD protection circuit of this embodiment includes a resistor 20, a MOS transistor 30 and a field device 50 having a double-gate structure. Generally, the resistor 20 is formed by an N-type diffusion region on a substrate. The function of the resistor 20 is to delay a sudden electrostatic stress between the input port 2 of the integrated circuit and an input point 4 of the internal circuit so that gates of the PMOS 6 and NMOS 8 are protected from ESD damage. The MOS device 30 provides a ground path before gates of the PMOS 6 and NMOS 8 and speeds-up triggering of the field device 50 to an "on" state to form an ESD path. When an electrostatic current applied to the input port 2 flows to the ground through the conducted MOS 30 from the resistor 20, a potential difference is produced between both ends of the resistor 20 such that the gate voltage of the field device 50 is increased, thereby speeding up the trigger action of the field device 50 to an "on" state. The source and drain of the field device 50 are coupled to the input port 2 of the integrated circuit and the low-voltage source of the integrated circuit (or ground) A first gate 50a of the field device 50 is coupled to the drain of the field device 50 while the second gate 50b of the field device 50 is coupled to the source of the field device 50.

Figure 1:
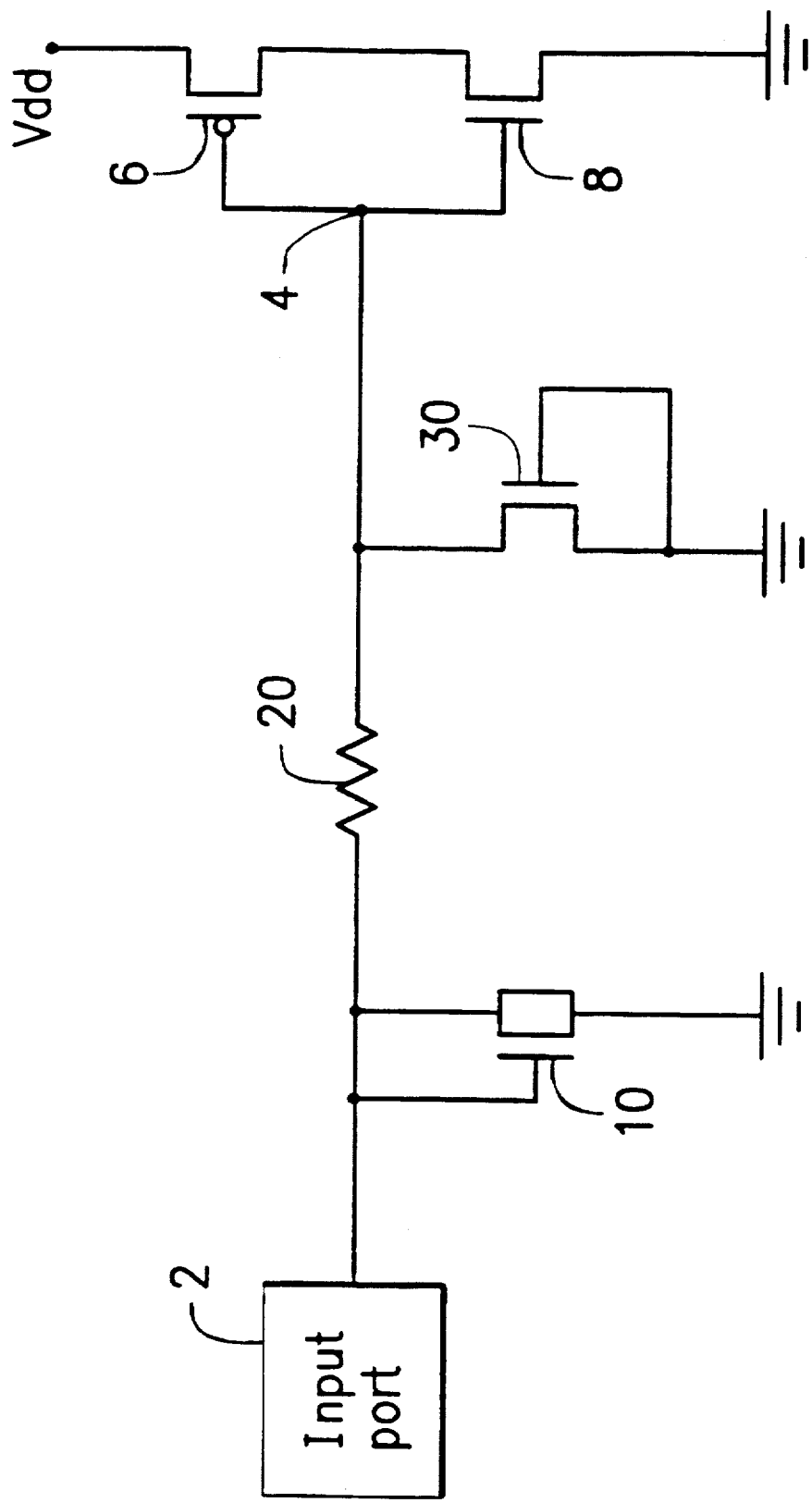
FIG. 1 is a schematic diagram of a conventional ESD protection circuit for a CMOS integrated circuit.
Figure 2:
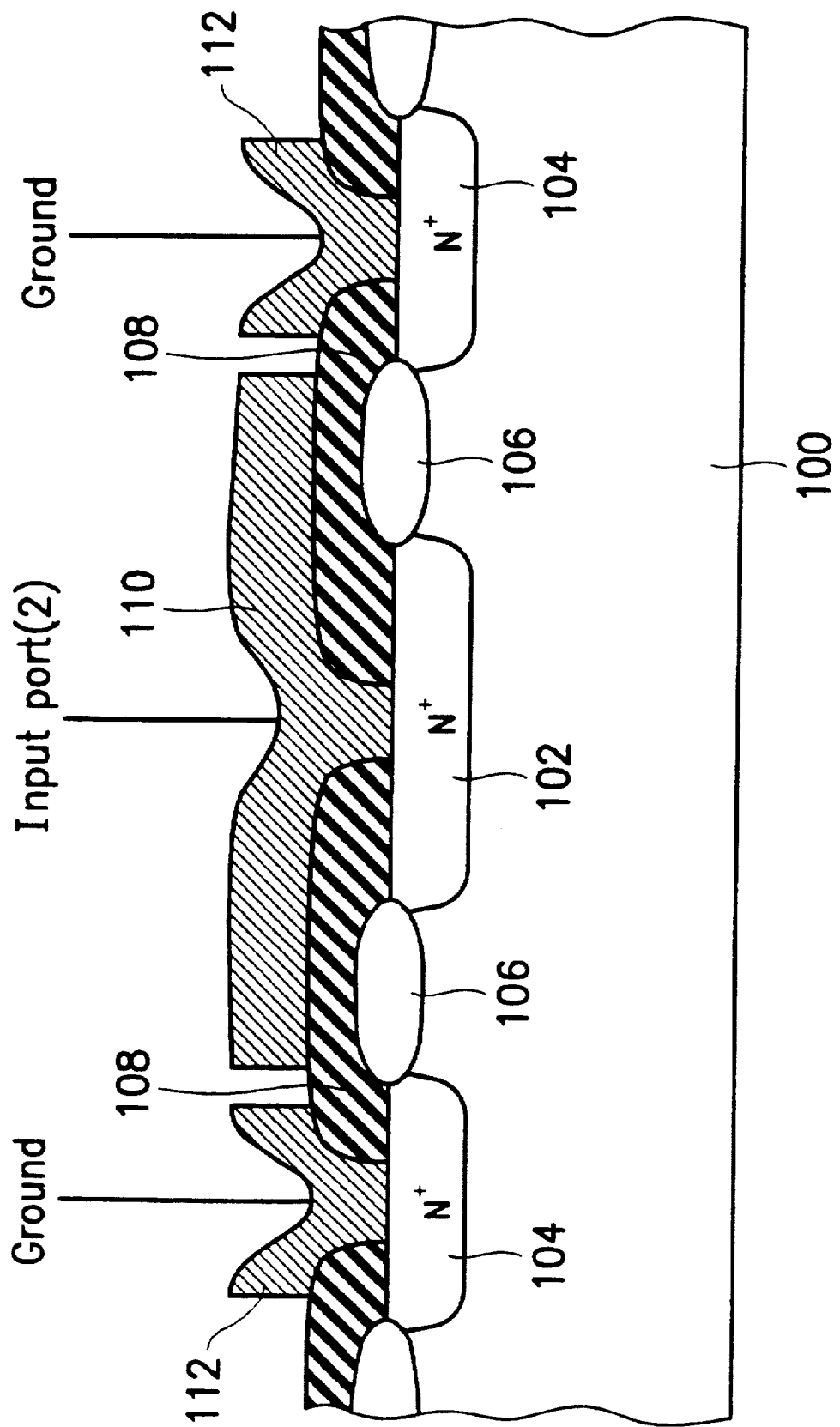
FIG. 2 is a cross-sectional side view of a field device of the ESD protection circuit of FIG. 1.
Figure 3:
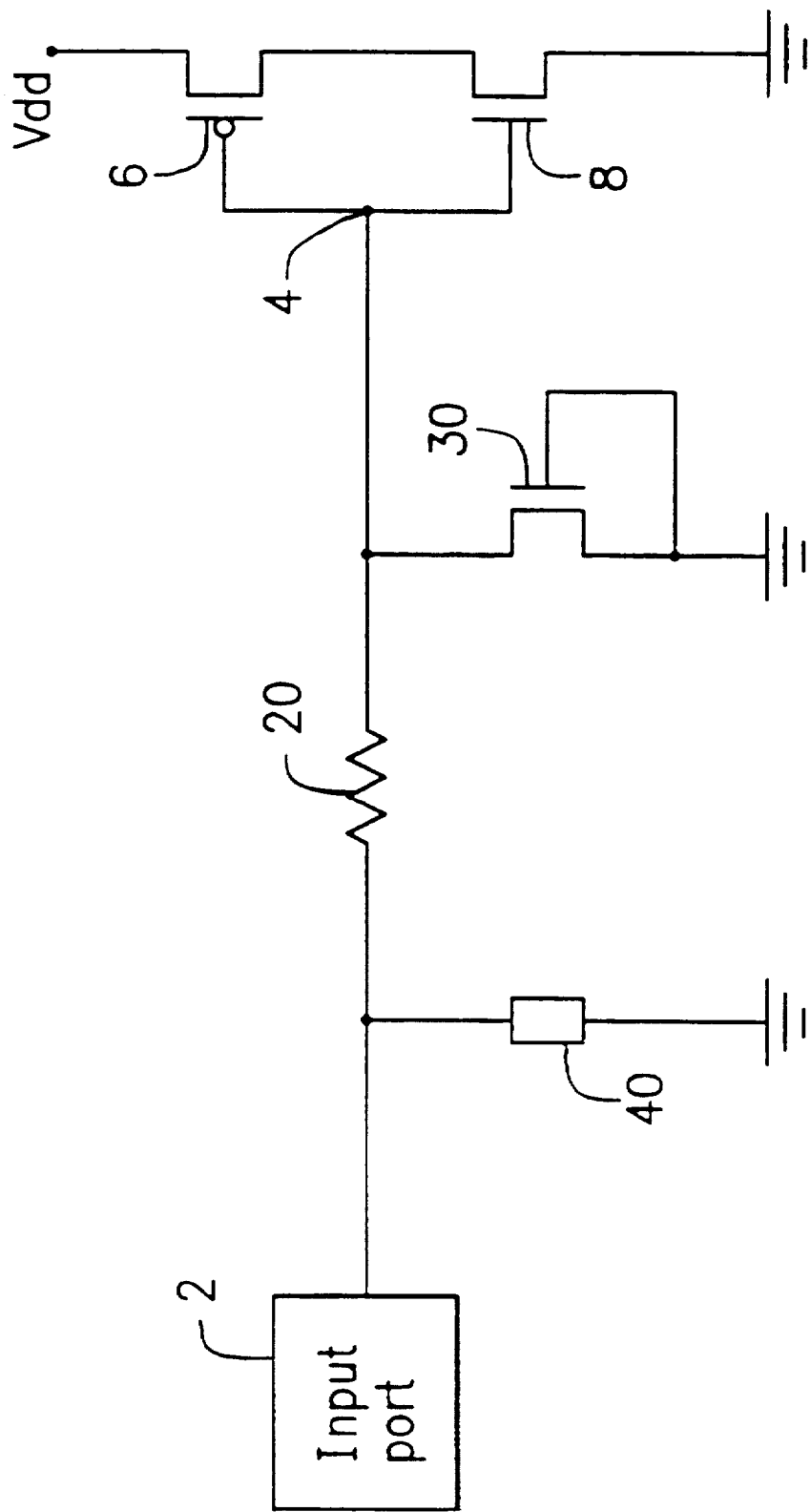
FIG. 3 is a schematic diagram of another conventional ESD protection circuit for a CMOS integrated circuit.
Figure 4:
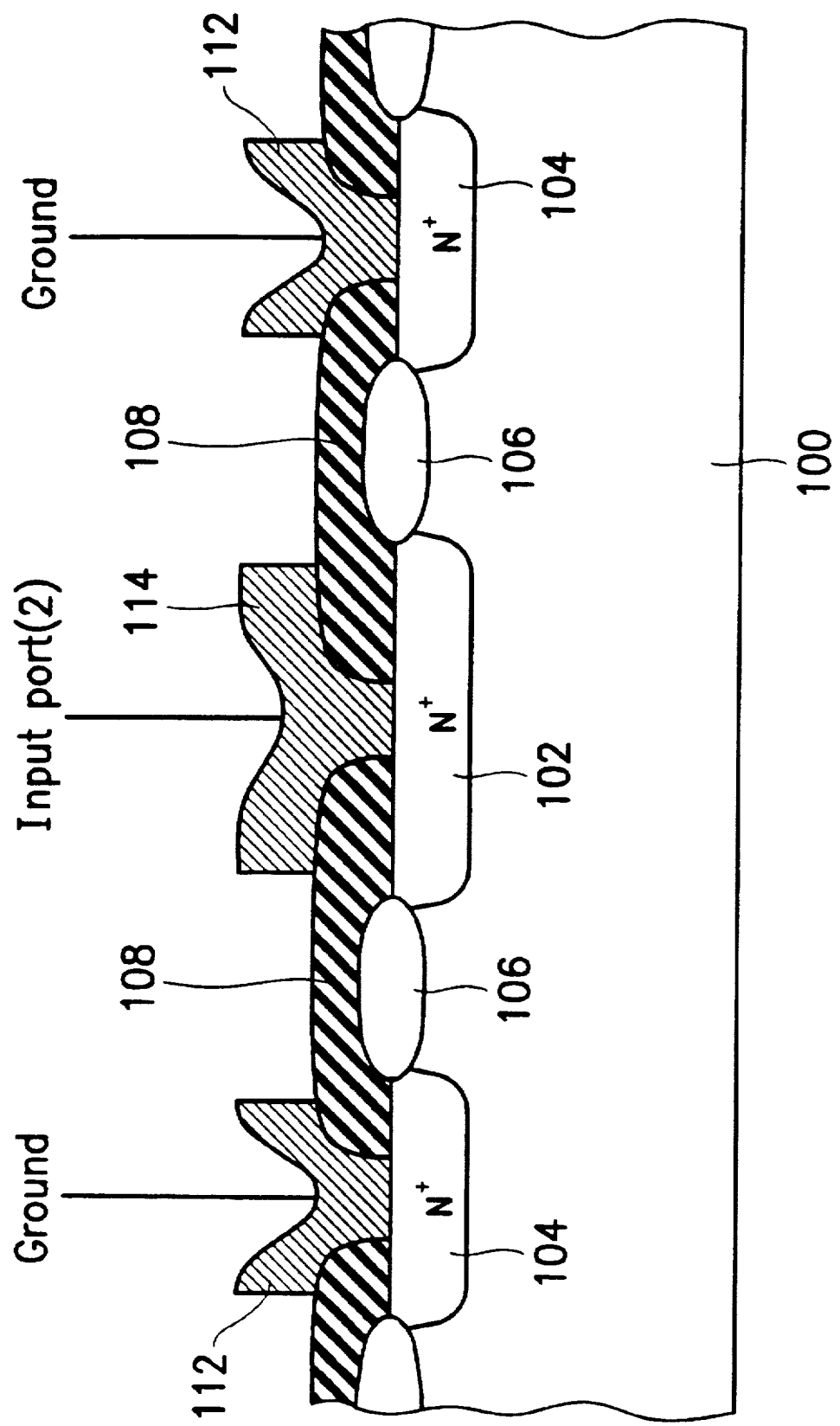
FIG. 4 is a cross-sectional view of a field device of the ESD protection circuit of FIG. 3.
Figure 7:
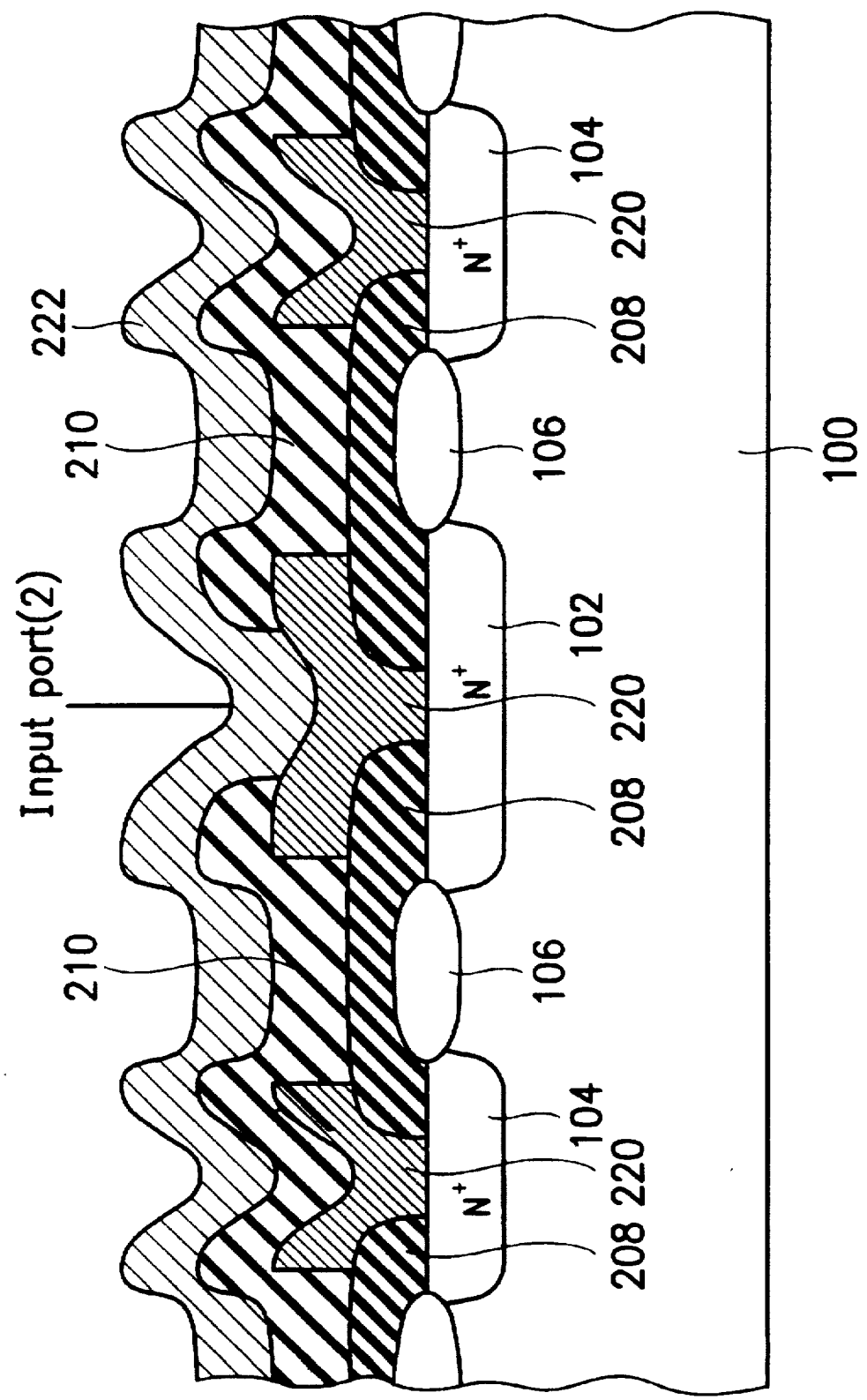
FIG. 7 is a cross-sectional side view of a first gate region of the field device of the invention.
Figure 8:
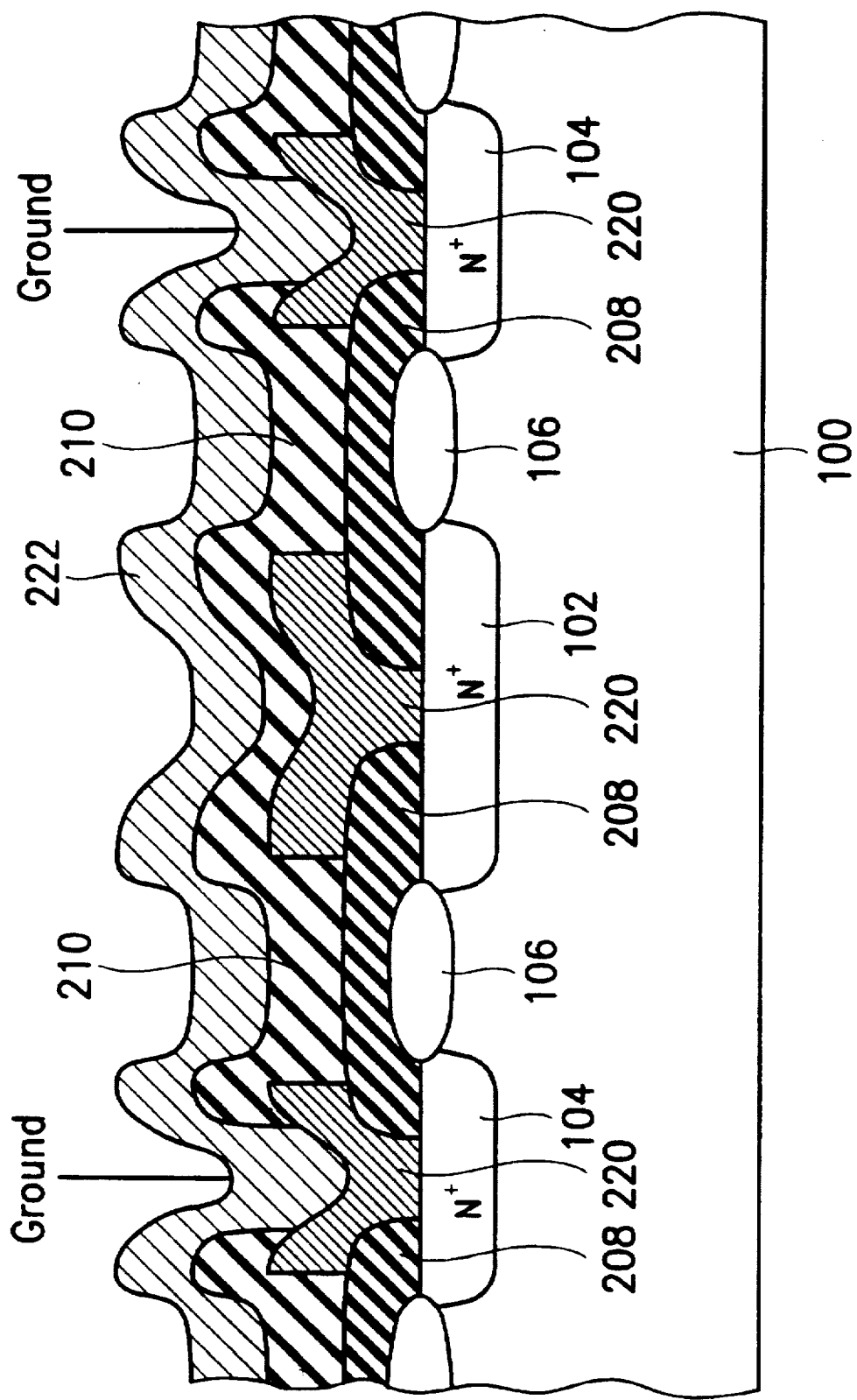
FIG. 8 is a cross-sectional side view of a second gate region of the field device of the invention.

FIG. 7 and FIG. 8 show cross-sectional side views of the first gate 50a and the second gate 50b of the field device 50, respectively, with materials the same as those in FIG. 2 and FIG. 4 labeled with the same reference numerals. The ESD protection circuit of the invention includes two metal layers, a first metal layer 220 and a second metal layer 222. A dielectric layer 210, located between the first metal layer and the second metal layer, is an electric insulation layer. A dielectric layer 208 located between the first metal layer 220 and source 104/drain 102 is an electric insulation layer. The first metal layer has a plurality of lead sections which contact the drain 102 and source 104 of the field device 50, but the field oxide 106 is not directly covered by the first metal layer. Instead, the field oxide 106 is covered indirectly by the second metal layer 222 to form the first gate 50a and the second gate 50b of the field device. In FIG. 7, the second metal layer 222 is connected to a lead section (contact via) of the first metal layer 220 which contacts the drain 102. That is, the first gate 50a of the field device 50 is coupled to the drain 102. In FIG. 8, the second metal layer 222 is connected to a lead section (contact via) of the first metal layer 220 which contacts the source 104. That is, the second gate 50b of the field device 50 is coupled to the source 104.

In the embodiment, a CMOS discussed above integrated circuit was used as an example. However, the same ESD protection circuit can also be utilized for an NMOS or PMOS integrated circuit. In a CMOS integrated circuit, the ESD protection circuit can be formed on a P-type substrate or a P-type well region. In other MOS integrated circuit, the ESD protection circuit can also be formed on an appropriate doped substrate.

The Second Embodiment

Figure 6:
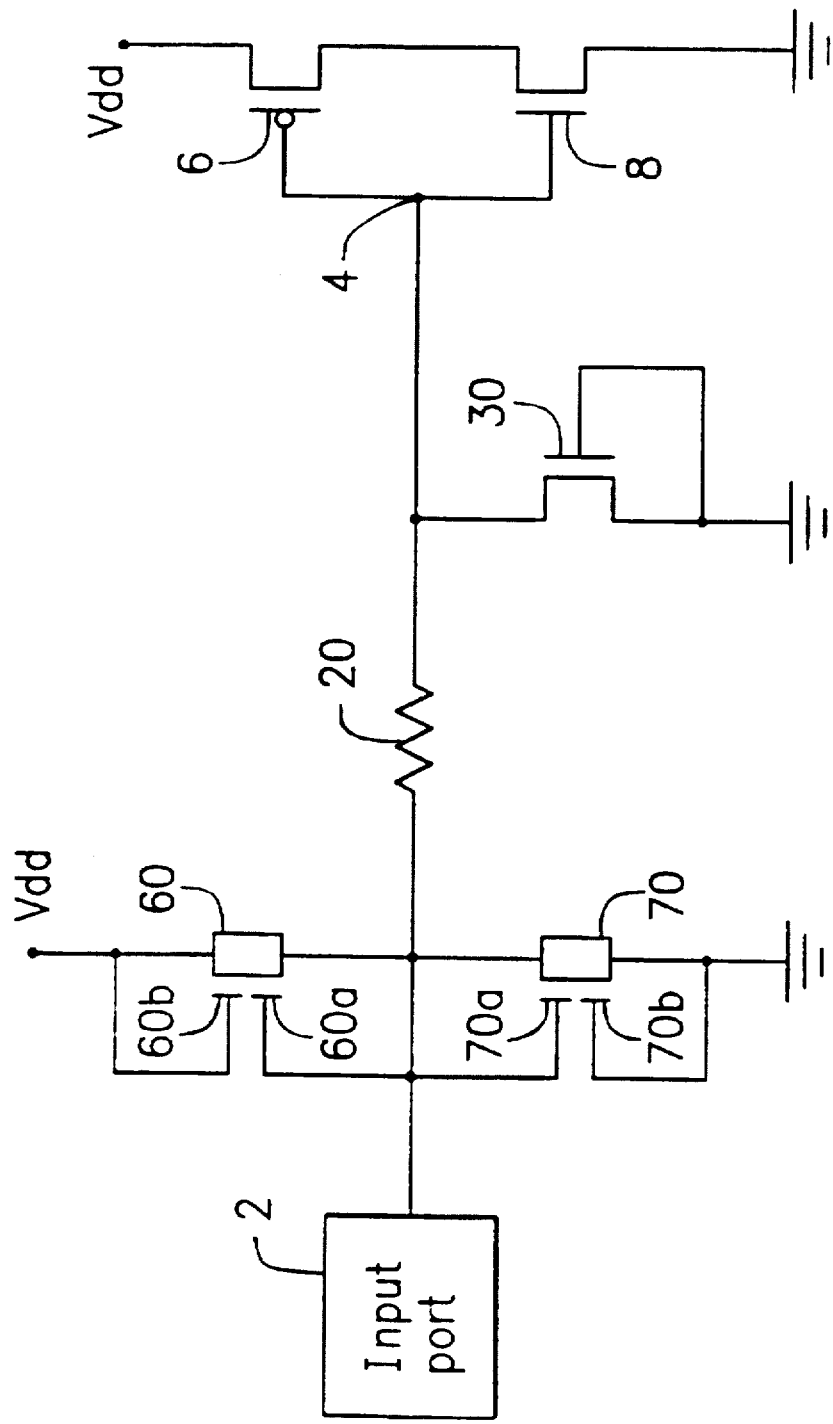
FIG. 6 is a schematic diagram of another embodiment of an ESD protection circuit of the invention.

FIG. 6 is a schematic depiction of an ESD protection circuit of the second invention embodiment. The ESD protection circuit of the second embodiment differs from that of the first embodiment in that the second embodiment has two double-gate field devices 60 and 70. The drain and source of field device 70 are connected to an input port 2 and a ground, respectively. The first gate 70a of field device 70 is connected to the drain thereof while the second gate 70b of the field device 70 is connected to the source thereof. The drain and source of the field device 60 are connected to the input port 2 and a high-voltage source $V_{dd}$, respectively. The first gate 60a of the field device 60 is connected to the drain thereof while the second gate 60b of the field device 60 is connected to the source thereof. The functions of a resistor 20 and a MOS device 30 are the same as those in the first embodiment. In this second embodiment, field devices 60, 70 provide different electric conducted paths to enhance the ESD protection. Furthermore, the structure of the field devices 60 and 70 are the same as that of the field device 50 in the first embodiment.

In the first and second embodiments, a plurality of field devices can be connected in parallel with each other to enhance the ESD protection. The MOS device 30 for speeding up the triggering action of the field device(s) is preferably formed with a non-lightly doped drain (non-LDD) structure. Although, MOS devices having a LDD structure are widely used in submicron devices, an LLD structure is preferably not used in the ESD protection circuit due to higher resistance of the LDD structure. Thus, the MOS device having a non-LDD structure adopted in the invention can enhance the ESD protection. In summary, the ESD protection circuit of the invention not only prevents the formation of a hotspot region occurring near the drain, but also produces uniform breakdown to attain ESD protection.

Although the invention is disclosed by the preferred embodiment, it is not intended to limit the invention. Those knowledgeable in the art can make modifications within the scope and spirit of the invention which is determined by the claims below.

What is claimed is:

1. An input port electrostatic discharge protection circuit for an integrated circuit, disposed between an input port of an integrated circuit and an input point of an internal circuit, comprising:

a resistor having a pair of ends, one end connected to the input port of said integrated circuit and the other end connected to the input point of said internal circuit;

a field oxide device including a drain, a source, a first gate, and a second gate, said drain and said source coupled to the input port of the integrated circuit and a low-voltage source of the integrated circuit, respectively, said first gate coupled to the drain of said field oxide device and said second gate coupled to the source of said field oxide device, wherein said field oxide device further includes a field oxide, a first metal layer and a second metal layer, wherein said first metal layer has a pair of lead sections which are connected to the source and drain of said field oxide device, respectively, said field oxide not covered directly by said first metal layer and said field oxide being covered indirectly by said second metal layer to form said first gate and said second gate, said first gate and said second gate being coupled to the drain and source of said field oxide device, respectively, via said first metal layer.

2. The input port electrostatic discharge protection circuit for an integrated circuit as claimed in claim 1 wherein said resistor is formed as a diffusion resistor on said integrated circuit.

3. The input port electrostatic discharge protection circuit for an integrated circuit as claimed in claim 1 wherein said field oxide device is a metal-oxide-semiconductor transistor formed on a field oxide which serves as a gate oxide of said metal-oxide-semiconductor transistor.

4. The input port electrostatic discharge protection circuit for an integrated circuit as claimed in claim 1 further comprising:

a semiconductor device coupled between the input point of said internal circuit and the low-voltage of said integrated circuit to speed-up triggering of said field oxide device to an "on" state.

5. The input port electrostatic discharge protection circuit for an integrated circuit as claimed in claim 4 wherein said semiconductor device is a metal-oxide-semiconductor transistor with a non-lightly-doped drain structure.

6. The input port electrostatic discharge protection circuit for an integrated circuit as claimed in claim 1 further comprising a dielectric layer, wherein said dielectric layer is located between said field oxide and said second metal layer.

7. The input port electrostatic discharge protection circuit for an integrated circuit as claimed in claim 6 further comprising a second dielectric layer, wherein said second dielectric layer is located between said field oxide and said second metal layer.

8. The input port electrostatic discharge protection circuit for an integrated circuit as claimed in claim 1 wherein the field oxide has a thickness of about 0.4 to 1.0 µm.

9. An input port electrostatic discharge protection circuit for an integrated circuit disposed between an input port of an integrated circuit and an input point of an internal circuit, comprising:

a resistor having a pair of ends, one end connected to the input port of said integrated circuit and the other end connected to the input point of said internal circuit a first field oxide device including a drain, a source, a first gate, and a second gate, said drain and said source coupled to the input port of said integrated circuit and a high-voltage source of said integrated circuit, respectively, said first gate coupled to the drain of said field oxide device and said second gate coupled to the source of said field oxide device; and a second field oxide device including a drain, a source, a first gate, and a second gate, said drain and said source coupled to the input port of said integrated circuit and a low-voltage source of said integrated circuit, respectively, said first gate coupled to the drain of said field oxide device and said second gate coupled to the source of said field oxide device; and wherein at least one of said first and second field oxide devices further includes a field oxide, a first metal layer and a second metal layer, wherein said first metal layer has a pair of lead sections which are connected, respectively, to the source and drain of said at least one of said first and second field oxide devices, said field oxide not covered directly by said first metal layer, and said field oxide being covered indirectly by said second metal layer to form said first gate and said second gate of said at least one of said first and second field oxide devices, said first gate and said second gate of said at least one of said first and second field oxide devices being coupled, respectively, to the drain and source of said at least one of said first and second field oxide devices via said first metal layer.

10. The input port electrostatic discharge protection circuit for an integrated circuit as claimed in claim 9 said resistor is formed as a diffusion resistor on said integrated circuit.

11. The input port electrostatic discharge protection circuit for an integrated circuit as claimed in claim 9 wherein said first field oxide device is a metal-oxide-semiconductor transistor formed on a field oxide which serves as a gate oxide layer of said metal-oxide-semiconductor transistor.

12. The input port electrostatic discharge protection circuit for an integrated circuit as claimed in claim 9 wherein the other one of one of said first and second field oxide devices comprises another first metal layer and another second metal layer wherein said another first metal layer has a pair of lead sections which are connected, respectively, to the source and drain of said the other one of one of said first and second field oxide devices, said field oxide not covered directly by said another first metal layer, and said field oxide being covered indirectly by said another second metal layer to form said first gate and said second gate of the other one of one of said first and second field oxide devices, said first gate and said second gate of the other one of one of said first and second field oxide devices being coupled, respectively, to the drain and source of the other one of one of said first and second field oxide devices, via said another first metal layer.

13. The input port electrostatic discharge protection circuit for an integrated circuit as claimed in claim 12 wherein said resistor is formed as a diffusion resistor on said integrated circuit.

14. The input port electrostatic discharge protection circuit for an integrated circuit as claimed in claim 12 further comprising a dielectric layer, wherein said dielectric layer is located between said another second metal layer and said field oxide of the other one of said first and second field oxide devices.

15. The input port electrostatic discharge protection circuit for an integrated circuit as claimed in claim 14 further comprising a second dielectric layer, wherein said second dielectric layer is located between said another second metal layer and said field oxide of the other one of said first and second field oxide devices.

16. The input port electrostatic discharge protection circuit for an integrated circuit as claimed in claim 9 further comprising:

a semiconductor device coupled between the input point of said internal circuit and the low-voltage of said integrated circuit to speed-up triggering of said first field oxide device and said second field oxide device to an "on" state.

17. The input port electrostatic discharge protection circuit for an integrated circuit as claimed in claim 16 wherein said semiconductor device is a metal-oxide-semiconductor transistor with a non-lightly-doped drain structure.

18. The input port electrostatic discharge protection circuit for an integrated circuit as claimed in claim 9 further comprising a dielectric layer, wherein said dielectric layer is located between said second metal layer and said field oxide of said at least one of said first and second field oxide devices.

19. The input port electrostatic discharge protection circuit for an integrated circuit as claimed in claim 18 further comprising a second dielectric layer, wherein said second dielectric layer is located between said second metal layer and said field oxide of said at least one of said first and second field oxide devices.

20. The input port electrostatic discharge protection circuit for an integrated circuit as claimed in claim 9 wherein the field oxide has a thickness of about 0.4 to 1.0 μm.

21. An input port electrostatic discharge protection circuit for an integrated circuit, disposed between an input port of an integrated circuit and an input point of an internal circuit, comprising:

a resistor having a pair of ends, one end connected to the input port of said integrated circuit and the other end connected to the input point of said internal circuit; and a field oxide device comprising a drain region, a source region, a first gate, and a second gate, said drain region and said source region coupled to the input port of the integrated circuit and a low-voltage source of the integrated circuit, respectively, said first gate coupled to the drain region of said field oxide device and said second gate coupled to the source region of said field oxide device, said field oxide device including:

a first metal layer having a first lead section connected to the source region and a second lead section connected to the drain region of said field oxide device, the first and second lead sections defining a window region therebetween;

a field oxide disposed within the window region and between the drain region and the source region;

a dielectric layer formed within the window region and over the field oxide; and a second metal layer formed over the dielectric layer and having third and fourth lead sections associated with the first and second gates, respectively, the third lead section connected to the drain region via the second lead section of the first metal layer and the fourth lead section connected to the source region via the first lead section of the first metal layer.

22. The input port electrostatic discharge protection circuit for an integrated circuit as claimed in claim 21 further comprising a second dielectric layer, wherein said second dielectric layer is located between said field oxide and said second metal layer.

23. The input port electrostatic discharge protection circuit for an integrated circuit as claimed in claim 21 further comprising a second field oxide device comprising a second drain region, a second source region, a third gate, and a fourth gate, said second drain region and said second source region coupled to the input port of the integrated circuit and a high-voltage source of the integrated circuit, respectively, said third gate coupled to the second drain region of said second field oxide device and said fourth gate coupled to the second source region of said second field oxide device, said second field oxide device including:

the first metal layer having a fifth lead section connected to the second source region and a sixth lead section connected to the second drain region of said second field oxide device, the fifth and sixth lead sections defining a second window region therebetween;

a second field oxide disposed within the second window region and between the second drain region and the second source region;

the dielectric layer further formed within the second window region and over the second field oxide; and the second metal layer formed over the dielectric layer over the second field oxide and having seventh and eighth lead sections associated with the third and fourth gates, respectively, the seventh lead section connected to the second drain region via the sixth lead section of the first metal layer and the eight lead section connected to the second source region via the fifth lead section of the first metal layer.

* * * * *